United States Patent
Kim et al.

(10) Patent No.: US 10,547,287 B2
(45) Date of Patent: Jan. 28, 2020

(54) FILTER AND FRONT END MODULE INCLUDING THE SAME

(71) Applicant: SAMSUNG ELECTRO-MECHANICS CO., LTD., Suwon-si (KR)

(72) Inventors: Hyung Kim, Suwon-si (KR); Won Kyu Jeung, Suwon-si (KR); Sung Tae Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/808,970

(22) Filed: Nov. 10, 2017

(65) Prior Publication Data

US 2018/0226945 A1   Aug. 9, 2018

(30) Foreign Application Priority Data

Feb. 3, 2017   (KR) .................. 10-2017-0015813
May 26, 2017   (KR) .................. 10-2017-0065525

(51) Int. Cl.
*H03H 9/54*    (2006.01)
*H01Q 5/328*   (2015.01)

(52) U.S. Cl.
CPC ............ *H03H 9/547* (2013.01); *H01Q 5/328* (2015.01); *H03H 9/54* (2013.01)

(58) Field of Classification Search
CPC .......... H03H 9/54; H03H 9/587; H03H 9/605; H03H 9/0542; H03H 9/1014; H03H 9/542; H01Q 5/328

USPC ............................................... 333/188
See application file for complete search history.

(56) References Cited

U.S. PATENT DOCUMENTS

| | | | |
|---|---|---|---|
| 6,262,637 B1 | 7/2001 | Bradley et al. | |
| 6,774,857 B2 | 8/2004 | Frank | |
| 7,863,699 B2 | 1/2011 | Dropmann et al. | |
| 2009/0251235 A1* | 10/2009 | Belot | H03H 9/542 333/187 |
| 2012/0231751 A1 | 9/2012 | Oka et al. | |
| 2015/0145610 A1 | 5/2015 | Ruby et al. | |
| 2016/0315653 A1 | 10/2016 | Saji et al. | |
| 2016/0344100 A1 | 11/2016 | Onaka et al. | |
| 2016/0352310 A1* | 12/2016 | Tani | H03H 9/64 |
| 2017/0155376 A1* | 6/2017 | Yamaguchi | H03H 9/64 |
| 2018/0367118 A1 | 12/2018 | Jian | |

FOREIGN PATENT DOCUMENTS

JP   5075188 B2   11/2012
KR   10-2014-0128054 A   11/2014

OTHER PUBLICATIONS

Unted States Office Action dated Jul. 24, 2018 in related U.S. Appl. No. 15/816,149 (10 pages in English).

(Continued)

*Primary Examiner* — Benny T Lee
*Assistant Examiner* — Hafizur Rahman
(74) *Attorney, Agent, or Firm* — NSIP Law

(57) ABSTRACT

A filter may include one or more series unit, and a shunt unit disposed between the one or more series unit and ground. The one or more series unit includes a plurality of series resonators which are selectively operated, and each of the plurality of series resonators includes a film bulk acoustic resonator.

18 Claims, 13 Drawing Sheets

(56) References Cited

OTHER PUBLICATIONS

Brown et al., "Power MOSFET Basics: Understanding MOSFET Characteristics Associated With the Figure of Merit", *Vishay Siliconix*, Sep. 2003, pp. 1-4 (4 pages in English).
Mahon et al., "BAW Flip-Chip Switched Filter Bank Delivers Dramatic Form Factor Reduction", *High Frequency Electronics*, Aug. 2008, pp. 24-28 (4 pages in English).
Bi et al., "Bulk Acoustic Wave RF Technology", *IEEE Microwave Magazine*, Oct. 2008, pp. 65-80 (16 pages in English).
LTE Frequency band,http://niviuk.free.fr/lte_band.php, Released on Dec. 16, 2018 (5 pages in English).
Gao et al., "A Method Determining Order of BAW Ladder-Type Filter", *Proceedings of SPIE*, vol. 10799, SPIE Security + Defense, 2018. (8 pages in English).
United States Office Action dated May 16, 2019 in corresponding U.S Appl. No. 15/802,627 (16 pages in English).
United States Office Action dated Jun. 14, 2019 in corresponding U.S Appl. No. 15/810,675 (14 pages in English).

\* cited by examiner

| COMMUNICATIONS BAND | Tx[MHz] | Rx[MHz] |
|---|---|---|
| B1 | 1920 – 1980 | 2110 – 2170 |
| B2 | 1850 – 1910 | 1930 – 1990 |
| B3 | 1710 – 1785 | 1805 – 1880 |
| B4 | 1710 – 1755 | 2110 – 2155 |
| B5 | 824 – 849 | 869 – 894 |
| B6 | 830 – 840 | 875 – 885 |
| B7 | 2500 – 2570 | 2620 – 2690 |
| B8 | 880 – 915 | 925 – 960 |
| B9 | 1749.9 – 1784.9 | 1844.9 – 1879.9 |
| B10 | 1710 – 1770 | 2110 – 2170 |
| B11 | 1427.9 – 1452.9 | 1475.9 – 1500.9 |
| B12 | 698 – 716 | 728 – 746 |
| B13 | 777 – 787 | 746 – 756 |
| B14 | 788 – 798 | 758 – 768 |
| B15 | 1900 – 1920 | 2600 – 2620 |
| B16 | 2010 – 2025 | 2585 – 2600 |
| B17 | 704 – 716 | 734 – 746 |
| B18 | 815 – 830 | 860 – 875 |
| B19 | 830 – 845 | 875 – 890 |
| B20 | 832 – 862 | 791 – 821 |
| B21 | 1447.9 – 1462.9 | 1495.5 – 1510.9 |
| B22 | 3410 – 3500 | 3510 – 3600 |
| B23 | 2000 – 2020 | 2180 – 2200 |
| B24 | 1625.5 – 1660.5 | 1525 – 1559 |
| B25 | 1850 – 1915 | 1930 – 1995 |
| B65 | 1920 – 2010 | 2110 – 2200 |
| B66 | 1710 – 1780 | 2110 – 2200 |

FIG. 1A

FILTER AND FRONT END MODULE INCLUDING THE SAME

CROSS-REFERENCE TO RELATED APPLICATION(S)

This application claims benefit of priority under 35 USC § 119(a) to Korean Patent Application Nos. 10-2017-0015813 filed on Feb. 3, 2017 and 10-2017-0065525 filed on May 26, 2017 in the Korean Intellectual Property Office; the entire disclosures of which are incorporated herein by reference for all purposes.

BACKGROUND

Field

The description relates to a filter and a front end module including the same.

Description of Related Art

In accordance with the rapid development of mobile communications devices, chemical and biological devices, and the like, demand for small, light filters, oscillators, resonant elements, acoustic resonant mass sensors, and the like, used in such devices, has also increased.

As a member for implementing such small, light filters, oscillators, resonant elements, acoustic resonant mass sensors, and the like, a film bulk acoustic resonator (FBAR) has been used. Such a film bulk acoustic resonator may be mass-produced at low cost, and may be implemented to have subminiature size. In addition, the FBAR may have a high quality factor (Q) value, a main characteristic of a filter, implemented therein, may be used even in a microwave frequency band, and may allow for the use of particular bands of a personal communications system (PCS) and a digital cordless system (DCS).

Recently, as wireless terminals have been implemented with the ability to support communications within a plurality of bands, a plurality of filters controlling the plurality of bands have been used in the wireless terminals. However, when the number of filters controlling the plurality of bands is increased in accordance with the increase in the number of bands, a signal processing process may become complicated, while manufacturing costs and a size of a filter module may be increased.

SUMMARY

In one general aspect, a filter includes one or more series units, and a shunt unit disposed between the one or more series units and ground, the one or more series units includes a plurality of series resonators which are selectively operated, and each of the plurality of series resonators includes a film bulk acoustic resonator. The one or more series units may include a first series resonator and a second series resonator, which have different resonant frequencies.

A frequency band of the filter may vary depending on selective operation of the first series resonator and the second series resonator. An upper limit frequency of the frequency band may vary depending on selective operation of the first series resonator and the second series resonator.

A resonant frequency of the first series resonator may be higher than that of the second series resonator, and the frequency band, depending on an operation of the first series resonator, is wider, depending on an operation of the second series resonator. The first series resonator and the second series resonator may be connected to each other in parallel.

The one or more series units may further include a first switch connected to the first series resonator in series and a second switch connected to the second series resonator in series.

The first series resonator and the second series resonator may be selectively operated, depending on switching operations of the first switch and the second switch. The first series resonator, the second series resonator, the first switch, and the second switch may be on a single chip. The filter may further comprise a notch filter connected to one of the plurality of filters in series, and the notch filter and filter module may be on the same chip.

A front end module includes an antenna transmitting and receiving radio frequency signals, a filter module including a plurality of filters filtering a specific frequency band in the radio frequency signals transmitted and received through the antenna, a notch filter connected to one of the plurality of filters in series and selectively operated, wherein the notch filter and the filter module are on a single chip.

A frequency band of the one filter may vary depending on a selective operation of the notch filter. The front end module of claim 11, wherein an upper limit frequency of the one filter varies depending on the selective operation of the notch filter. A unique frequency band of the one filter may be wider than the frequency band of the one filter at the time of operation of the notch filter. A switch may selectively connect the notch filter and the one filter to each other. The switch may be together with the notch filter and the filter module on a single chip.

BRIEF DESCRIPTION OF DRAWINGS

The above and other aspects, features, and advantages of the description will be more clearly understood from the following detailed description taken in conjunction with the accompanying drawings, in which:

FIG. 1A is a table provided to illustrate frequencies of transmit bands and receive bands of communications bands according to an example;

DETAILED DESCRIPTION

Hereinafter, embodiments of the present disclosure will be described in detail with reference to the accompanying drawings.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein, the term "and/or" includes any one and any combination of any two or more of the associated listed items. The term "or" used alone does not necessarily rule out the possibility of both options being selected.

Figure 1B:
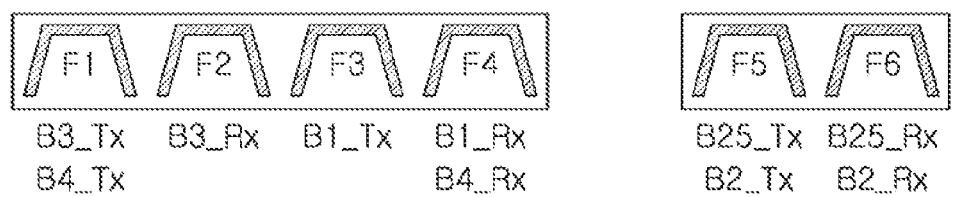
FIG. 1B is a view provided to illustrate a filter module according to an example and communications bands supported by the filter module.

FIG. 1A is a table provided to illustrate frequencies of transmit bands and receive bands of communications bands according to an embodiment. FIG. 1B is a view provided to illustrate a filter module according to an embodiment and communications bands supported by the filter module.

Communications bands illustrated in FIG. 1A may be long term evolution (LTE) communications band, and communications bands B1 to B25, B65, and B66 may include transmit bands Tx known as an uplink band and receive bands Rx known as a downlink band.

Referring to FIG. 1B, the filter module may include a plurality of filters, which may control transmit bands and receive bands of communications bands supported by the filter module.

When the filter module supports the communications bands B1, B2, B3, B4, and B25, the plurality of filters may control communications bands B1_Tx, B1_Rx, B2_Tx, B2_Rx, B3_Tx, B3_Rx, B4_Tx, B4_Rx, B25_Tx, and B25_Rx in order to transmit and receive radio frequency signals.

When the plurality of filters include six filters F1 to F6 corresponding to a number smaller than 10, which is the number of required transmit bands and received bands, some of the six filters F1 to F6 may control two bands of which bandwidths partially overlap one another.

Referring to FIG. 1B, the filter F1 may control the communications bands B3_Tx and B4_Tx, the filter F2 may control the communications band B3_Rx, the filter F3 may control the communications band B1_Tx, and the filter F4 may control the communications bands B1_Rx and B4_Rx. In addition, the filter F5 may control the communications bands B2_Tx and B25_Tx, and the filter F6 may control the communications bands B2_Rx and B25_Rx. As an example, the filters F1, F2, F3, and F4 may constitute a quadplexer, and the filters F5 and F6 may constitute a duplexer.

The filter module of FIG. 1B supports a larger number of communications bands than that of filters included in the filter module, but one filter module needs to control a larger number of communications bands in order to decrease the size of a space occupied by the filter module in a wireless terminal that has recently been significantly integrated and made slimmer.

Figure 2:
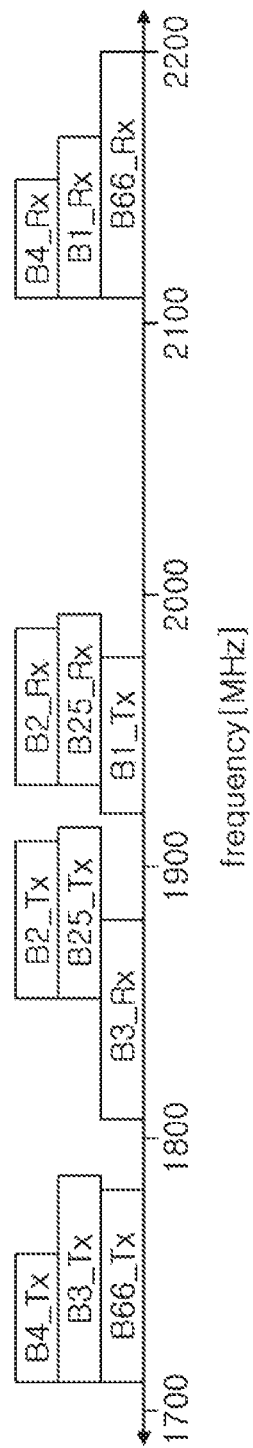
FIG. 2 is a view provided to illustrate communications bands supported by a filter module according to an embodiment.

FIG. 2 is a view provided to illustrate communications bands supported by a filter module according to an embodiment.

Referring to FIG. 2, when the filter module supports the communications bands B1, B2, B3, B4, B25, and B66, a plurality of filters used in the filter module may control communications bands B1_Tx, B1_Rx, B2_Tx, B2_Rx, B3_Tx, B3_Rx, B4_Tx, B4_Rx, B25_Tx, B25_Rx, B66_Tx, and B66_Rx.

Referring to FIGS. 1A and 2, bandwidths of the communications bands B3_Tx, B4_Tx, and B66_Tx may partially overlap one another, bandwidths of the communications bands B3_Rx, B25_Tx, and B2_Tx may partially overlap one another, bandwidths of the communications bands B1_Tx, B25_Rx, and B2_Rx may partially overlap one another, and bandwidths of the communications bands B1_Rx, B4_Rx, and B66_Rx may partially overlap one another.

The filter module according to an embodiment may include a plurality of filters, and one or more filters may control bands having overlapping bandwidths, such that the size and manufacturing costs of the filter module may be decreased.

Figure 3:
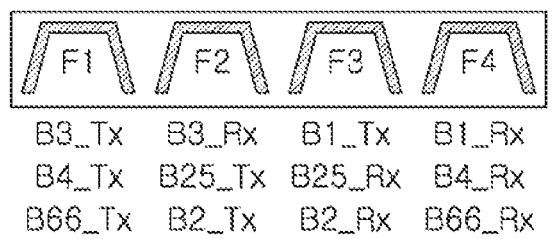
FIG. 3 is a view provided to illustrate the filter module according to an embodiment.

FIG. 3 is a view provided to illustrate the filter module according to an embodiment.

According to an embodiment, one or more of a plurality of filters used in the filter module may control two or more communications bands of which bandwidths partially overlap one another.

Referring to FIGS. 1A and 3, the filter module may include a plurality of filters F1, F2, F3, and F4. The plurality of filters F1, F2, F3, and F4 may constitute one of a quadplexer and a duplexer.

When the filter module includes four filters F1, F2, F3, and F4, the filter F1 may control the communications bands B3_Tx, B4_Tx, and B66_Tx of which bandwidths partially overlap one another, the filter F2 may control the communications band B3_Rx, B25_Tx, and B2_Tx of which bandwidths partially overlap one another, the filter F3 may control the communications band B1_Tx, B25_Rx, and B2_Rx of which bandwidths partially overlap one another, and the filter F4 may control the communications bands B1_Rx, B4_Rx, and B66_Rx of which bandwidths partially overlap one another. When the four filters F1 to F4 control the bands of which the bandwidths overlap one another as illustrated in FIG. 3, the number of filters that control the bands may be decreased.

According to an embodiment, two or more communications bands that one or more filter(s) of the filter module controls may have different upper limit frequencies and lower limit frequencies. As an example, the filter F2 may control the communications band B3_Rx having a lower limit frequency of 1805 MHz and an upper limit frequency of 1880 MHz, the communications band B2_Tx having a lower limit frequency of 1850 MHz and an upper limit frequency of 1910 MHz, and the communications band B25_Tx having a lower limit frequency of 1850 MHz and an upper limit frequency of 1915 MHz. In addition, the filter F3 may control the communications band B1_Tx having a lower limit frequency of 1920 MHz and an upper limit frequency of 1980 MHz, the communications band B2_Rx having a lower limit frequency of 1930 MHz and an upper limit frequency of 1990 MHz, and the communications band B25_Rx having a lower limit frequency of 1930 MHz and an upper limit frequency of 1995 MHz.

Referring to FIGS. 1A, 2, and 3, an interval between a frequency band 1805 MHz to 1915 MHz supported by the filter F2 and a frequency band 1920 MHz to 1995 MHz supported by the filter F3 may be narrow (approximately 5 MHz). Therefore, when the filter F2 and the filter F3 use frequency bands allocated thereto as they are, there may be a risk that interference will be generated in radio frequency signals transmitted to and received by the filter F2 and the filter F3.

In the filter module according to an embodiment, when frequency bands of different filters supporting adjacent frequency bands have a difference of 1 MHz to 10 MHz therebetween, the frequency bands of the different filters may be varied, depending on the mode, to prevent generation of interference in radio frequency signals transmitted to and received by the filters.

As an example, the filter F2 may adjust an upper limit frequency within a range of 1880 MHz to 1915 MHz to vary a frequency band allocated thereto, and the filter F3 may adjust a lower limit frequency within a range of 1920 MHz to 1930 MHz to vary a frequency band allocated thereto.

Figure 4:
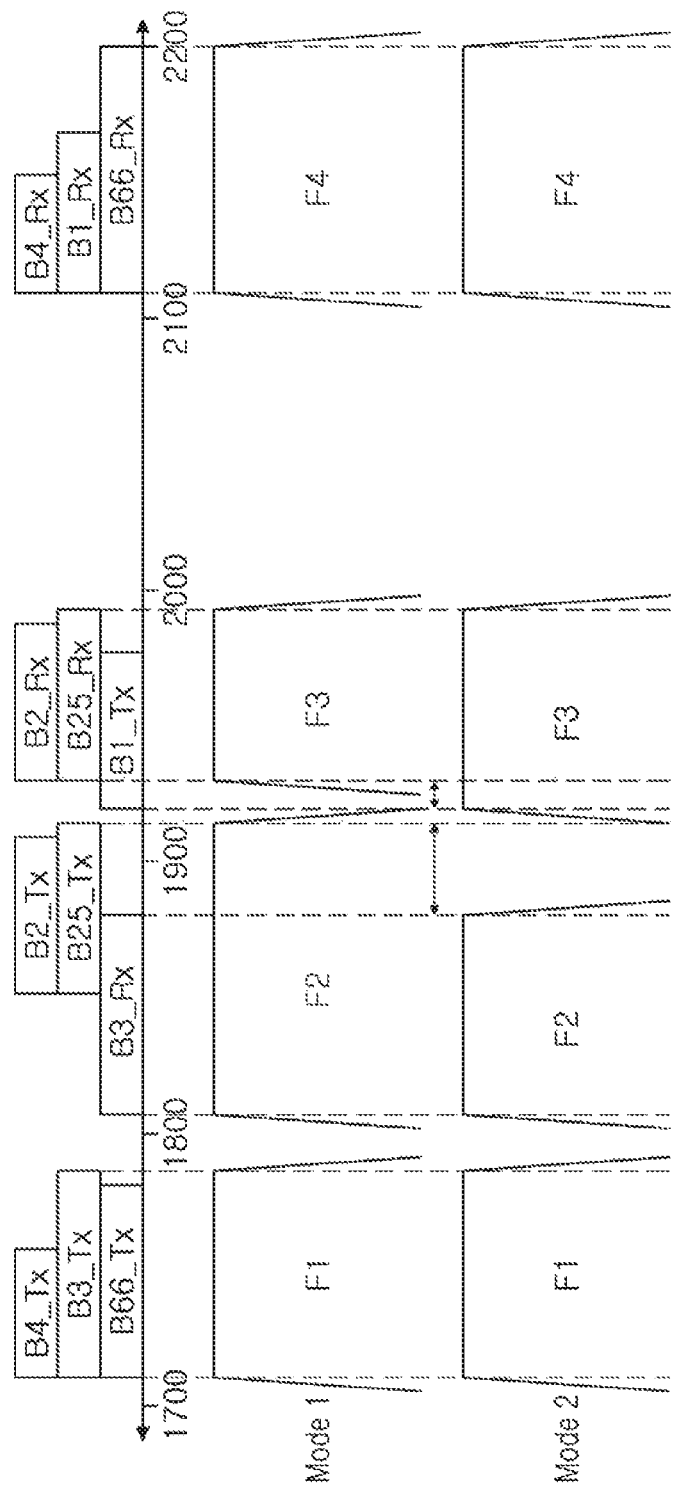
FIG. 4 is a view provided to illustrate modes of the filter module according to an embodiment.

FIG. 4 is a view provided to illustrate modes of the filter module according to an embodiment.

Referring to FIG. 4, the filter module may be operated in a first mode and a second mode. Bandwidths allocated to the filter F1 and the filter F4 may be fixed, and bandwidths allocated to the filter F2 and the filter F3 may be adjusted in order to avoid interference of frequency signals, regardless of mode. As an example, the upper limit frequency of the filter F2 is changed, such that the bandwidth of the filter F2 may be adjusted, and the lower limit frequency of the filter F3 is changed, such that the bandwidth of the filter F3 may be adjusted. Here, when the upper limit frequency of the filter F2 is increased, such that the bandwidth of the filter F2 is increased, the lower limit frequency of the filter F3 is increased, such that the bandwidth of the filter F3 may be decreased. In addition, when the upper limit frequency of the filter F2 is decreased, such that the bandwidth of the filter F2 is decreased, the lower limit frequency of the filter F3 is decreased, such that the bandwidth of the filter F3 may be increased.

In detail, the upper limit frequency of the filter F2 is increased so that the filter F2 controls the communications bands B3_Rx, B_25Tx, and B2_Tx in the first mode Mode 1, such that the bandwidth of the filter F2 may be increased, and the upper limit frequency of the filter F2 is decreased so that the filter F2 controls the communications band B3_Rx in the second mode Mode 2, such that the bandwidth of the filter F2 may be decreased.

In addition, the lower limit frequency of the filter F3 is increased so that the filter F3 controls the communications bands B_25Rx, and B2_Rx in the first mode Mode 1, such that the bandwidth of the filter F3 may be decreased, and the lower limit frequency of the filter F3 is decreased so that the filter F3 controls the communications bands B1_Tx, B_25Rx, and B2_Rx in the second mode Mode 2, such that the bandwidth of the filter F3 may be decreased.

Figure 5:
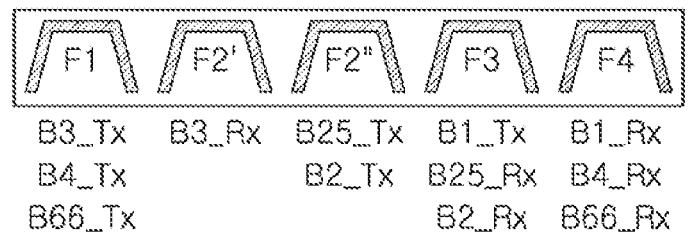
FIG. 5 is a view provided to illustrate a filter module according to an embodiment.

FIG. 5 is a view provided to illustrate the filter module according to an embodiment. Since the filter module of FIG. 5 is similar to the filter module of FIG. 3, descriptions of the same or overlapping example features will be omitted, and example features different from the example features of the filter module of FIG. 3 will be mainly described.

Referring to FIG. 5, the filter module may include a plurality of filters F1, F2', F2", F3, and F4. The plurality of filters F1, F2', F2", F3, and F4 may constitute one of a quadplexer and a duplexer. When the filter module includes five filters F1, F2', F2", F3, and F4, the filter F1 may control the communications bands B3_Tx, B4_Tx, and B66_Tx, the filter F2' may control the communications band B3_Rx, the filter F2" may control the communications bands B25_Tx and B2_Tx, the filter F3 may control the communications bands B1_Tx, B25_Rx, and B2_Rx, and the filter F4 may control the communications bands B1_Rx, B4_Rx, and B66_Rx.

Comparing FIGS. 3 and 5 with each other, the filter that controls the communications bands B3_Rx, B25_Tx, and B2_Tx may be divided into two filters in the filter module of FIG. 5, such that the filters F2' and F2" may be easily manufactured. Here, the filters F2' and F2" may be operated in different modes, such that interference between frequency bands supported by the filters F2' and F2" may be avoided.

Figure 6:
FIG. 6 is a view provided to illustrate a filter module according to an embodiment.

FIG. 6 is a view provided to illustrate the filter module according to an embodiment in the present disclosure. Since the filter module of FIG. 6 is somewhat similar to the filter module of FIG. 3, descriptions of the same or overlapping example features will be omitted, and example features different from the example features of the filter module of FIG. 3 will be mainly described.

Referring to FIG. 6, the filter module may include a plurality of filters F1, F2, F3', F3", and F4. The plurality of filters F1, F2, F3', F3", and F4 may constitute one of a quadplexer and a duplexer. When the filter module includes five filters F1, F2, F3', F3", and F4, the filter F1 may control the communications bands B3_Tx, B4_Tx, and B66_Tx, the filter F2 may control the communications bands B3_Rx, B25_Tx and B2_Tx, the filter F3' may control the communications band B1_Tx, the filter F3" may control the communications bands B25_Rx and B2_Rx, and the filter F4 may control the communications bands B1_Rx, B4_Rx, and B66_Rx.

Comparing FIGS. 3 and 6 with each other, the filter that controls the communications bands B1_Tx, B25_Rx, and B2_Rx may be divided into two filters in the filter module of FIG. 6, such that the filters F3' and F3" may be easily manufactured. Here, the filters F3' and F3" may be operated in different modes, such that interference between frequency bands supported by the filters F3' and F3" may be avoided.

Figure 7:
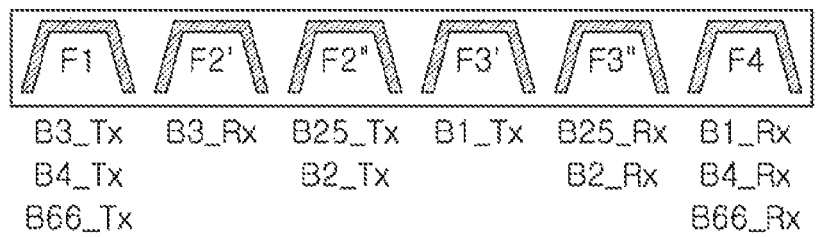
FIG. 7 is a view provided to illustrate a filter module according to an embodiment.

FIG. 7 is a view provided to illustrate a filter module according to an embodiment. Since the filter module of FIG. 7 is somewhat similar to the filter module of FIG. 3, descriptions of the same or overlapping example features will be omitted, and example features different from the example features of the filter module of FIG. 3 will be mainly described.

Referring to FIG. 7, the filter module may include a plurality of filters F1, F2', F2", F3', F3", and F4. The plurality of filters F1, F2', F2", F3', F3", and F4 may constitute one of a quadplexer and a duplexer. When the filter module includes six filters F1, F2', F2", F3', F3", and F4, the filter F1 may control the communications bands B3_Tx, B4_Tx, and B66_Tx, the filter F2' may control the communications band B3_Rx, the filter F2" may control the communications bands B25_Tx and B2_Tx, the filter F3' may control the communications band B1_Tx, the filter F3" may control the communications bands B25_Rx and B2_Rx, and the filter F4 may control the communications bands B1_Rx, B4_Rx, and B66_Rx.

Comparing FIGS. 3 and 7 with each other, the filter that controls the communications bands B3_Rx, B25_Tx, and B2_Tx may be divided into two filters in the filter module of FIG. 7, such that the filters F2' and F2" may be easily manufactured, and the filter that controls the communications bands B1_Tx, B25_Rx, and B2_Rx may be divided into two filters in the filter module of FIG. 7, such that the filters F3' and F3" may be easily manufactured.

The filters F2' and F2" may be operated in different modes, such that interference between frequency bands supported by the filters F2' and F2" may be avoided, and the filters F3' and F3" may be operated in different modes, such that interference between frequency bands supported by the filters F3' and F3" may be avoided.

Figure 8A:
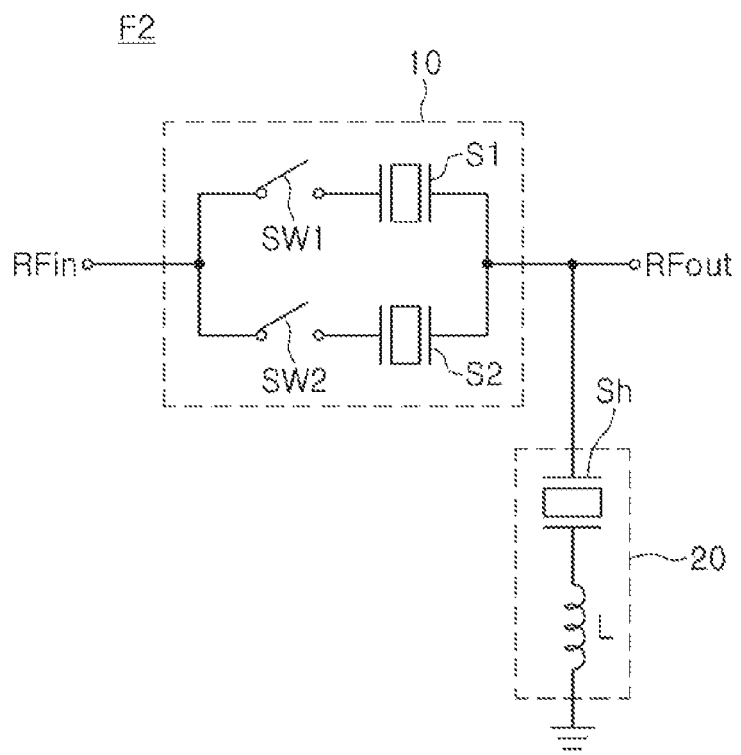
FIGS. 8A and 8B are views provided to illustrate a manner of changing an upper limit frequency according to an embodiment of FIG. 3.
Figure 8B:
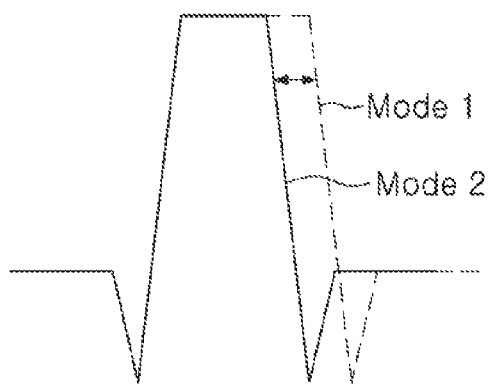

FIGS. 8A and 8B are views provided to illustrate a manner of changing an upper limit frequency according to an embodiment of FIG. 3. FIG. 8A is a circuit diagram illustrating the filter F2 of FIG. 3, and FIG. 8B is graphs illustrating a change in a frequency band of the filter F2.

Referring to FIG. 8A, the filter F2 according to an embodiment may include a plurality of resonators. Here, each of the plurality of resonators may include a film bulk acoustic resonator (FBAR).

The filter F2 may include one or more series units 10 and one or more shunt units 20 disposed between one or more series units 10 and ground. The filter F2 may be formed in a ladder type filter structure as illustrated in FIG. 8A, or may be formed in a lattice type filter structure.

One or more series units 10 may be disposed between a signal input terminal RFin to which an input signal is input and a signal output terminal RFout from which an output signal is output, and one or more shunt units 20 may be disposed between a connection node between one or more series units 10 and the signal output terminal RFout and ground or between a connection node between one or more series units 10 and the signal input terminal RFin and ground.

A case in which the filter F2 includes one series unit 10 and one shunt unit 20 is illustrated in FIG. 8A, but the numbers of series units 10 and shunt units 20 may also be plural, and when the filter F2 includes a plurality of series units 10 and a plurality of shunt units 20, the plurality of series units 10 may be connected to each other in series, and the shunt units 20 may be disposed between a node between the series units 10 connected to each other in series and ground. The shunt unit 20 may include one or more shunt resonator Sh, and may further include a trimming inductor disposed between the shunt resonator Sh and ground.

One or more series units 10 may include a first series resonator S1 and a second series resonator S2. The first series resonator S1 and the second series resonator S2 may be selectively operated. The first series resonator S1 and the second series resonator S2 may be connected to each other in parallel through a first switch SW1 and a second switch SW2. In detail, the first series resonator S1 and the first switch SW1 may be connected to each other in series, the second series resonator S2 and the second switch SW2 may be connected to each other in series, and the first series resonator S1 and the first switch SW1 connected to each other in series and the second series resonator S2 and the second switch SW2 connected to each other in series may be connected to each other in parallel. The first series resonator S1, the second series resonator S2, the first switch SW1, and the second switch SW2 may be manufactured as a single chip.

The first switch SW1 and the second switch SW2 may be switched in different modes. As an example, in the first mode Mode 1, the first switch SW1 may be turned on and the second switch SW2 may be turned off, and in the second mode Mode 2, the first switch SW1 may be turned off and the second switch SW2 may be turned on.

The first series resonator S1 and the second series resonator S2 may have different resonant frequencies and anti-resonant frequencies. As an example, a resonant frequency of the first series resonator S1 operated in the first mode Mode 1 may be higher than that of the second series resonator S2. Therefore, referring to FIG. 8B, in the first mode Mode 1, an upper limit frequency of the filter F2 may be increased by the first series resonator S1, such that a bandwidth of the filter F2 may be increased, and in the second mode Mode 2, the upper limit frequency of the filter F2 may be decreased by the second series resonator S2, such that the bandwidth of the filter F2 may be decreased.

Figure 9A:
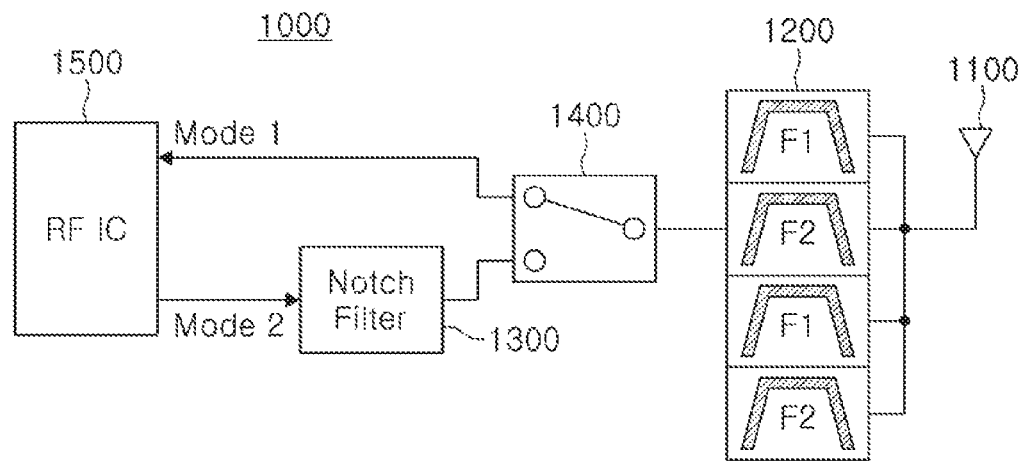
FIGS. 9A through 9C are views provided to illustrate a manner of changing an upper limit frequency according to an embodiment of FIG. 3.
Figure 9B:
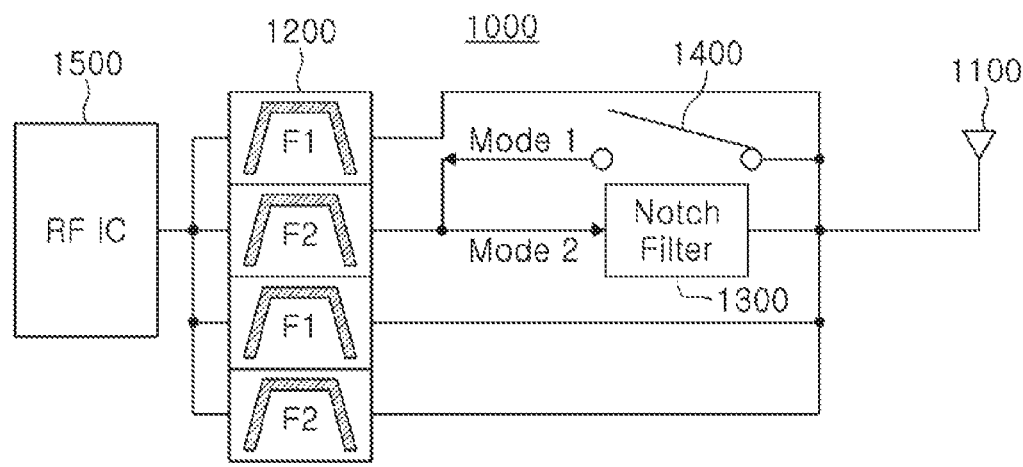
Figure 9C:
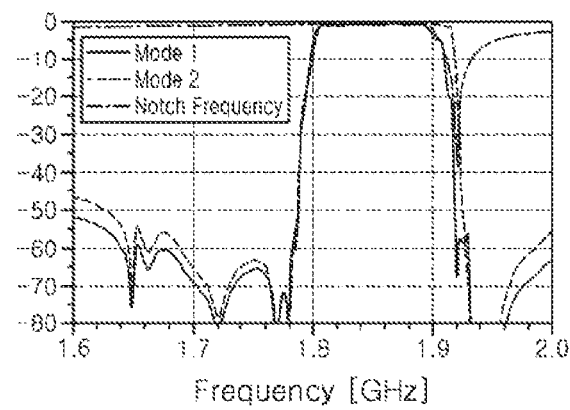

FIGS. 9A through 9C are views provided to illustrate a manner of changing an upper limit frequency according to an embodiment of FIG. 3.

FIGS. 9A and 9B are circuit diagrams illustrating a front end module according to the present an embodiment, and FIG. 9C is graphs illustrating a change in a frequency band of a filter F2 according to an embodiment.

Referring to FIGS. 9A and 9B, the front end module 1000 according to an embodiment may include an antenna 1100, a filter module 1200, a notch filter 1300, a switch 1400, and a radio frequency (RF) integrated circuit (IC) 1500. A plurality of filters F1, F2, F3, and F4 of the filter module 1200 may correspond to those of the filter module of FIG. 3. The plurality of filters F1, F2, F3, and F4 of the filter module 1200 and the notch filter 1300 may be manufactured using film bulk acoustic resonators (FBARs). In this case, the filter module 1200, the notch filter 1300, and the switch 1400 may be manufactured as a single chip.

The antenna 1100 may transmit and receive RF signals, and the filter module 1200 may perform a filter operation for passing or removing components in a specific frequency band in the RF signals received through the antenna 1100 or RF signals transmitted and received through the RF IC 1500. The filter module 1200 may correspond to the filter module of FIG. 3, and may include the plurality of filters F1, F2, F3, and F4.

The filter F2 of the filter module 1200 may be selectively connected to the notch filter 1300 on a mode. Therefore, the notch filter 1300 may be selectively operated. The notch filter 1300 may be disposed between the filter module 1200 and the RF IC 1500 or may be disposed between the filter module 1200 and the antenna 1100 and may be selectively connected to the filter F2 depending on the mode.

Referring to FIG. 9A, the notch filter 1300 and the switch 1400 connected to each other in series may be disposed between the filter module 1200 and the RF IC 1500. The switch 1400 may be a three-terminal switch of which a first terminal is connected to the filter module 1200, a second terminal is connected to the RF IC 1500, and a third terminal is connected to the notch filter 1300. The first terminal of the switch 1400 may be connected to one of the second terminal and the third terminal of the switch 1400 to connect the filter module 1200 and the RF IC 1500 to each other or connect the filter module 1200 and the notch filter 1300 to each other.

The switch 1400 may directly connect the filter F2 of the filter module 1200 and the RF IC 1500 to each other in the first mode, and may connect the filter F2 of the filter module 1200 and the RF IC 1500 to each other through the notch filter 1300 in the second mode.

Referring to FIG. 9B, the notch filter 1300 and the switch 1400 connected to each other in parallel may be disposed between the filter module 1200 and the antenna 1100. The switch 1400 may be turned on in the first mode to directly connect the filter F2 of the filter module 1200 and the antenna 1100 to each other, and may be turned off in the second mode, such that the filter F2 of the filter module 1200 may be connected to the antenna 1100 through the notch filter 1300.

Referring to FIG. 9C, when a path of RF signals through the notch filter 1300 depending on a switching operation of the switch 1400 in the first mode Mode 1 is not formed, a frequency band may be formed depending on a unique upper limit frequency and lower limit frequency of the filter F2. However, when a path of RF signals through the notch filter 1300 depending on a switching operation of the switch 1400 in the second mode Mode 2 is formed, an upper limit frequency of the filter F2 may be decreased by frequency characteristics of the notch filter 1300, such that a bandwidth of the filter F2 may be decreased.

Figure 10A:
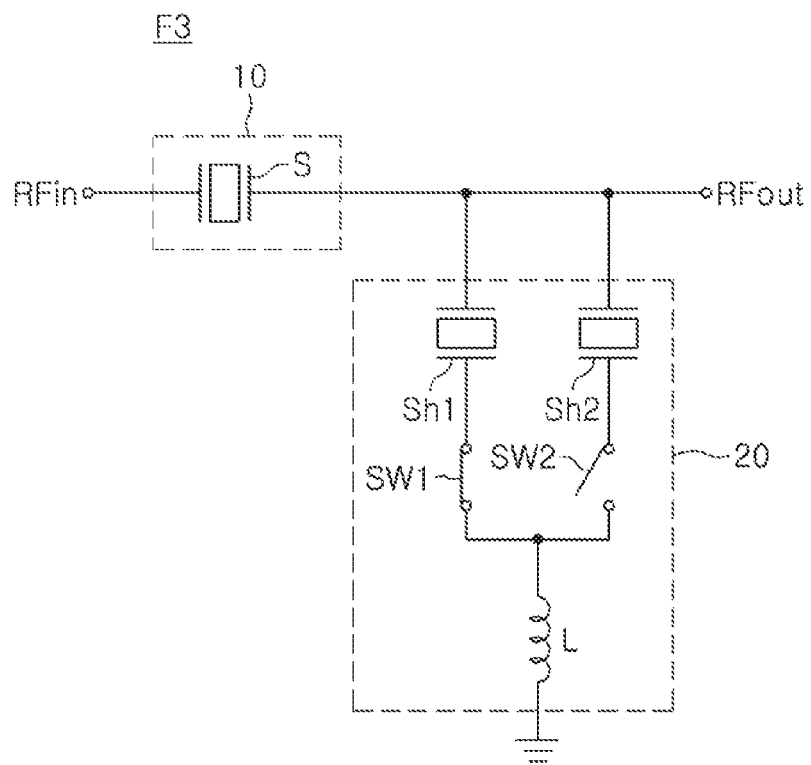
FIGS. 10A and 10B are views provided to illustrate a manner of changing a lower limit frequency according to an embodiment of FIG. 3.
Figure 10B:
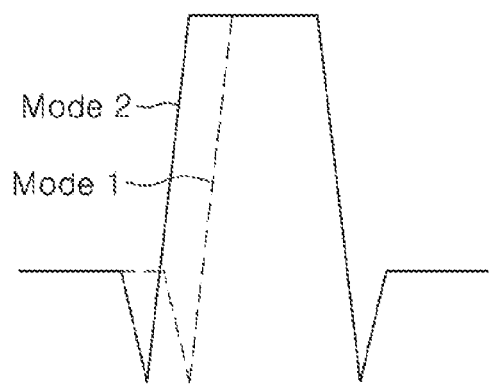

FIGS. 10A and 10B are views provided to illustrate a manner of changing a lower limit frequency according to an exemplary embodiment of FIG. 3. FIG. 10A is a circuit diagram illustrating the filter F3 of FIG. 3, and FIG. 10B is a graphic illustrating a change in a frequency band of the filter F3.

Referring to FIG. 10A, the filter F3 according to an embodiment may include a plurality of resonators. Here, each of the plurality of resonators may include a film bulk acoustic resonator (FBAR).

The filter F3 may include one or more series units 10 and one or more shunt units 20 disposed between series unit 10 and ground. The filter F3 may be formed in a ladder type filter structure as illustrated in FIG. 10A, or may be formed in a lattice type filter structure.

Series units 10 may be disposed between a signal input terminal RFin to which an input signal is input and a signal output terminal RFout from which an output signal is output, and shunt units 20 may be disposed between a connection node between series units 10 and the signal output terminal RFout and ground or between a connection node between series units 10 and the signal input terminal RFin and ground.

An embodiment in which the filter F3 includes one series unit 10 and one shunt unit 20 is illustrated in FIG. 10A, but the numbers of series units 10 and shunt units 20 may also be plural, and when the filter F3 includes a plurality of series units 10 and a plurality of shunt units 20, the plurality of series units 10 may be connected to each other in series, and the shunt units 20 may be disposed between a node between the series units 10 connected to each other in series and ground. The series unit 10 may include one or more series resonator S.

One or more shunt units 20 may include a first shunt resonator Sh1 and a second shunt resonator Sh2. The first shunt resonator Sh1 and the second shunt resonator Sh2 may be selectively operated.

The first shunt resonator Sh1 and the second shunt resonator Sh2 may be connected to each other in parallel through a first switch SW1 and a second switch SW2. In detail, the first shunt resonator Sh1 and the first switch SW1 may be connected to each other in series, the second shunt resonator Sh2 and the second switch SW2 may be connected to each other in series, and the first shunt resonator Sh1 and the first switch SW1 connected to each other in series and the second shunt resonator Sh2 and the second switch SW2 connected to each other in series may be connected to each other in parallel. The first shunt resonator Sh1 and the second shunt resonator Sh2 connected to each other in parallel may be connected to ground through a trimming inductor L. An embodiment in which the first shunt resonator Sh1 and the second shunt resonator Sh2 are connected to ground through one trimming inductor L is illustrated in FIG. 10A, but the first shunt resonator Sh1 and the second shunt resonator Sh2 may also be connected to ground through separate trimming inductors L.

The first switch SW1 and the second switch SW2 may be switched in different modes. As an example, in the first mode Mode 1, the first switch SW1 may be turned on and the second switch SW2 may be turned off, and in the second mode Mode 2, the first switch SW1 may be turned off and the second switch SW2 may be turned on.

The first shunt resonator Sh1 and the second shunt resonator Sh2 may have different resonant frequencies and anti-resonant frequencies. As an example, an anti-resonant frequency of the first shunt resonator Sh1 operated in the first mode Mode 1 may be higher than that of the second shunt resonator Sh2.

Therefore, referring to FIG. 10B, in the first mode Mode 1, a lower limit frequency of the filter F3 may be increased by the first shunt resonator Sh1, such that a bandwidth of the filter F3 may be decreased, and in the second mode Mode 2, the lower limit frequency of the filter F3 may be decreased by the second shunt resonator Sh2, such that the bandwidth of the filter F3 may be increased.

Figure 11A:
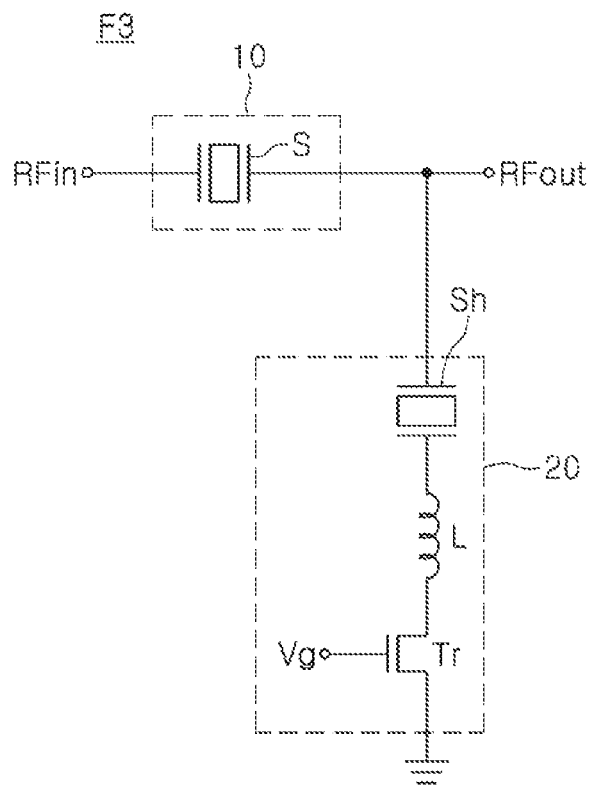
FIGS. 11A and 11B are views provided to illustrate a manner of changing a lower limit frequency according to an embodiment of FIG. 3.
Figure 11B:
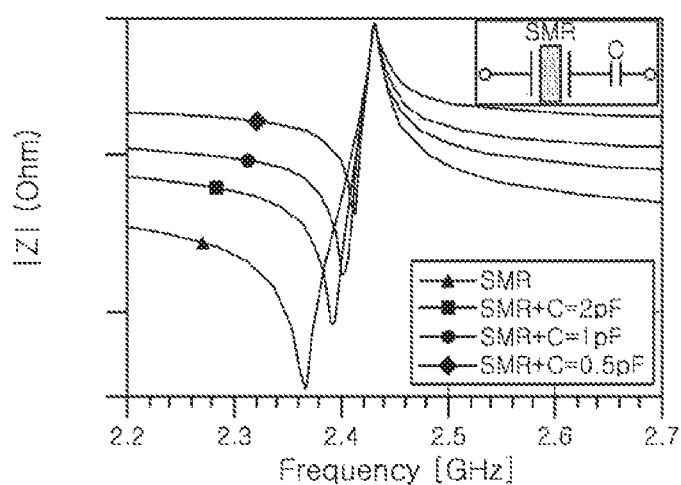

FIGS. 11A and 11B are views provided to illustrate a manner of changing a lower limit frequency according to an embodiment of FIG. 3.

FIG. 11A is a circuit diagram illustrating the filter F3 according to an embodiment, and FIG. 11B is a graphic illustrating a change in the frequency band of the filter F3 according to an embodiment.

The filter F3 according to an embodiment may include a plurality of resonators. Here, each of the plurality of resonators may include a film bulk acoustic resonator (FBAR).

The filter F3 may include one or more series units 10 and one or more shunt units 20 disposed between series units 10 and ground. The filter F3 may be formed in a ladder type filter structure as illustrated in FIG. 11A, or may be formed in a lattice type filter structure.

Series units 10 may be disposed between a signal input terminal RFin to which an input signal is input and a signal output terminal RFout from which an output signal is output, and shunt units 20 may be disposed between a connection node between series units 10 and the signal output terminal RFout and ground or between a connection node between series units 10 and the signal input terminal RFin and ground.

A case in which the filter F3 includes one series unit 10 and one shunt unit 20 is illustrated in FIG. 11A, but the numbers of series units 10 and shunt units 20 may also be plural, and when the filter F3 includes a plurality of series units 10 and a plurality of shunt units 20, the plurality of series units 10 may be connected to each other in series, and the shunt units 20 may be disposed between a node between the series units 10 connected to each other in series and ground. The series unit 10 may include one or more series resonator S.

The shunt unit 20 may include a shunt resonator Sh and a transistor Tr disposed between the shunt resonator Sh and ground, and may further include a trimming inductor L disposed between the shunt resonator Sh and the transistor Tr.

The transistor Tr may be implemented by one or both of an N-channel field effect transistor and a P-channel field effect transistor. The transistor Tr may be turned on or turned off by a gate voltage Vg applied to a gate thereof. In detail, the transistor Tr may be turned off in the first mode Mode 1, and may be turned on in the second mode, Mode 2. The transistor Tr may be equivalent to a resistor in a turn-on state, and may be equivalent to a capacitor in a turn-off state.

An anti-resonant frequency of the shunt unit 20 may be changed depending on operations of turning-on and turning-off the transistor Tr. Referring to FIG. 11B, when the transistor Tr is turned off in the first mode Mode 1, an entire capacitance of the shunt unit 20 may be decreased depending on a capacitance of the transistor Tr, such that the anti-resonant frequency of the shunt unit 20 may be increased. In addition, when the transistor Tr is turned on in the second mode Mode 2, the entire capacitance of the shunt unit 20 may be increased, such that the anti-resonant frequency of the shunt unit 20 may be decreased.

Therefore, when the transistor Tr is turned off in the first mode, Mode 1, a lower limit frequency of the filter F3 may be increased, such that a bandwidth of the filter F3 may be decreased, and when the transistor Tr is turned on in the second mode Mode 2, the lower limit frequency of the filter F3 may be decreased, such that the bandwidth of the filter F3 may be increased.

Figure 12A:
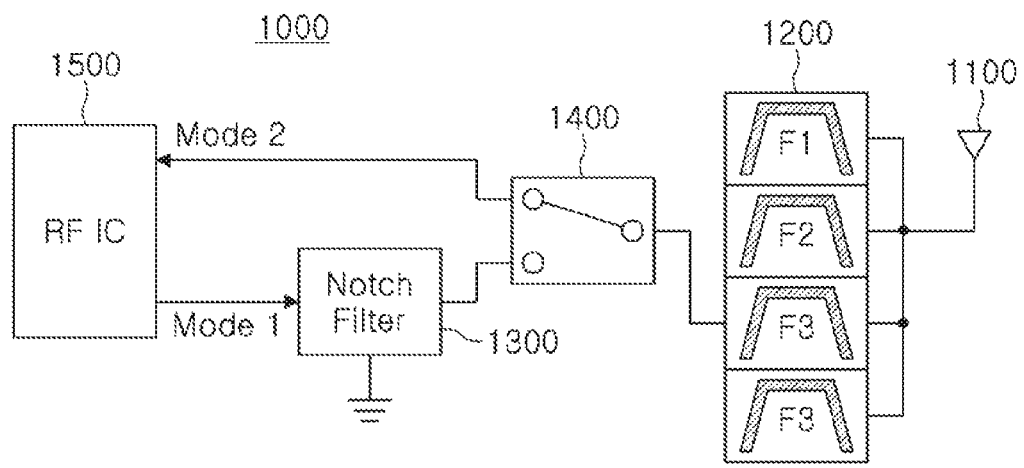
FIGS. 12A and 12B are views provided to illustrate a manner of changing a lower limit frequency according to an embodiment of FIG. 3.
Figure 12B:
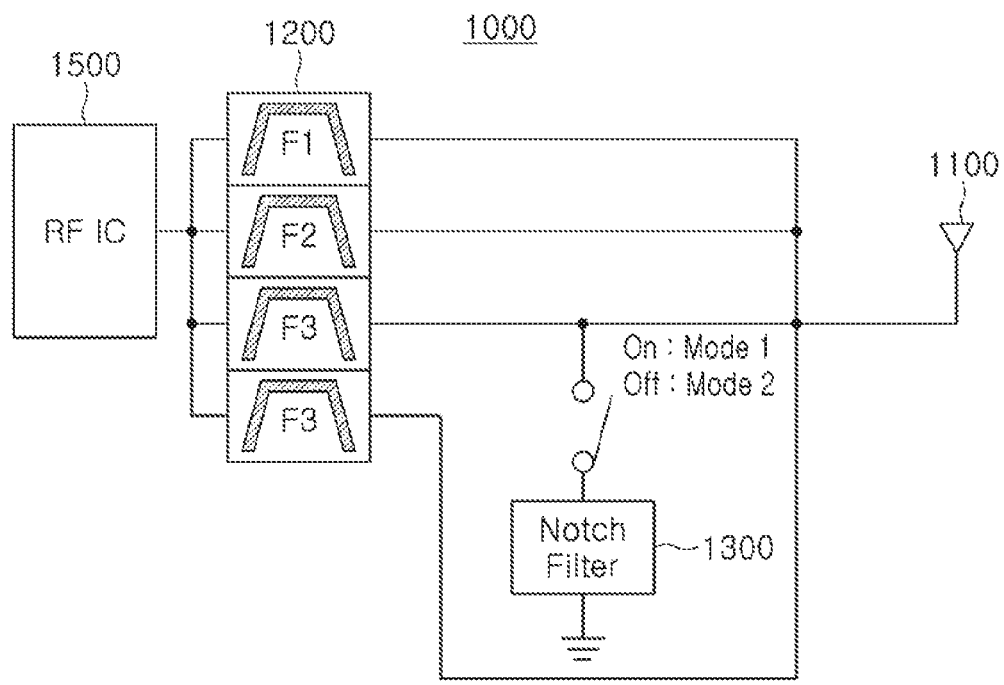

FIGS. 12A and 12B are views provided to illustrate a manner of changing a lower limit frequency according to an embodiment of FIG. 3.

FIGS. 12A and 12B are circuit diagrams illustrating a front end module according to an embodiment.

Referring to FIGS. 12A and 12B, the front end module 1000 according to an embodiment may include an antenna 1100, a filter module 1200, a notch filter 1300, a switch 1400, and a radio frequency (RF) integrated circuit (IC) 1500. A plurality of filters F1, F2, F3, and F4 of the filter module 1200 may correspond to those of the filter module of FIG. 3. The plurality of filters F1, F2, F3, and F4 of the filter module 1200 and the notch filter 1300 may be manufactured using film bulk acoustic resonators (FBARs). In this case, the notch filter 1300 and the switch 1400 disposed between the filter module 1200 and the notch filter 1300 may be manufactured as a single chip.

The antenna 1100 may transmit and receive RF signals, and the filter module 1200 may perform a filter operation for passing and removing components in a specific frequency band in the RF signals received through the antenna 1100 or RF signals transmitted and received through the RF IC 1500.

The filter module 1200 may correspond to the filter module of FIG. 3, and may include the plurality of filters F1, F2, F3, and F4.

The filter F3 of the filter module 1200 may be selectively connected to the notch filter 1300 on a mode. The notch filter 1300 may be connected between a signal path of the filter F3 and a ground and be selectively operated. The notch filter 1300 may be disposed between the filter module 1200 and the RF IC 1500 or may be disposed between the filter module 1200 and the antenna 1100 and may be selectively connected to the filter F3 depending on mode.

Referring to FIG. 12A, the notch filter 1300 and the switch 1400 may be disposed between the filter module 1200 and the RF IC 1500. Here, the notch filter 1300 may be connected to ground, such that ground potential may be provided to the notch filter 1300. The switch 1400 may be a three-terminal switch of which a first terminal is connected to the filter module 1200, a second terminal is connected to the RF IC 1500, and a third terminal is connected to the notch filter 1300. The first terminal of the switch 1400 may be connected to one of the second terminal and the third terminal of the switch 1400 to connect the filter module 1200 and the RF IC 1500 to each other or connect the filter module 1200 and the notch filter 1300 to each other.

The switch 1400 may directly connect the filter F3 of the filter module 1200 and the RF IC 1500 to each other in the first mode, and may connect the filter F2 of the filter module 1200 and the RF IC 1500 to each other through the notch filter 1300 in the second mode.

Referring to FIG. 12B, the notch filter 1300 and the switch 1400 may be disposed between the filter module 1200 and the antenna 1100. The switch 1400 may be connected to a connection node between the filter F3 of the filter module 1200 and the antenna 1100, and the notch filter 1300 may be disposed between the switch 1400 and ground.

The switch 1400 may be turned on in the first mode to connect the connection node between the filter F3 of the filter module 1200 and the antenna 1100 to the notch filter 1300, and may be turned off in the second mode, such that the antenna 1100 and the filter F3 of the filter module 1200 may be directly connected to each other.

Referring to FIGS. 12A and 12B, when a path of RF signals through the notch filter 1300 depending on a switching operation of the switch 1400 in the second mode is not formed, a frequency band may be formed depending on an upper limit frequency and a lower limit frequency of the filter F3. However, when a path of RF signals through the notch filter 1300 depending on a switching operation of the switch 1400 in the first mode is formed, a lower limit frequency of the filter F3 may be increased by frequency characteristics of the notch filter 1300, such that a bandwidth of the filter F3 may be decreased.

Figure 13:
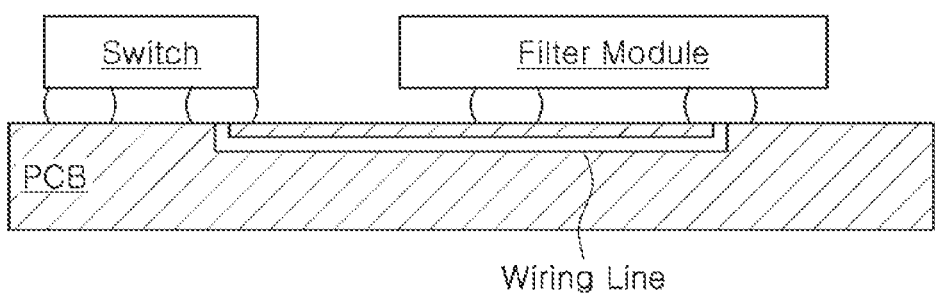
FIG. 13 is a schematic view provided to illustrate a manner of connecting a filter module according to an embodiment and a switch to each other.

FIG. 13 is a schematic view provided to illustrate a manner of connecting a filter module according to an example and a switch to each other.

As described above, the filter module and the front end module may include one or more switch and a transistor. However, as illustrated in FIG. 13, when the filter module and the switch are mounted on a printed circuit board PCB and are connected to each other through a wiring line provided in the printed circuit board PCB, signal loss may be generated due to a parasitic component generated in the wiring line, and miniaturization of the front end module may be easily limited due to an area occupied by the switch on the printed circuit board PCB.

In the filter module and the front end module according to an embodiment, the filter module and the switch may be integrated, such that the wiring line between the filter module and the switch may be significantly decreased. Therefore, the signal loss generated due to the parasitic component by the wiring line may be reduced, and the area occupied by the switch on the printed circuit board PCB may be removed to promote the miniaturization of the front end module.

Figure 14:
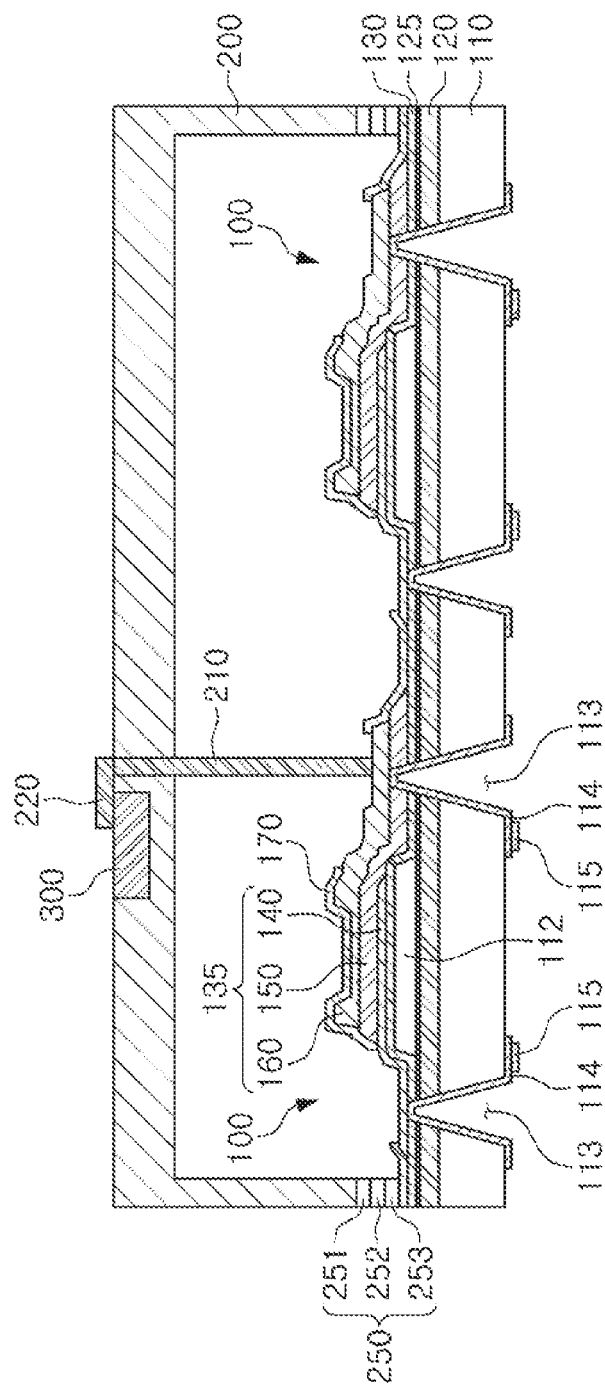
FIG. 14 is a cross-sectional view illustrating the filter module according to an embodiment.

FIG. 14 is a cross-sectional view illustrating a filter module according to an embodiment.

Referring to FIG. 14, the filter module according to an embodiment may include a plurality of bulk acoustic resonators 100 and a cap 200. The bulk acoustic resonator 100 may be a film bulk acoustic resonator (FBAR).

The bulk acoustic resonator 100 may be implemented by a multilayer structure including a plurality of films. A case in which two bulk acoustic resonators 100 are implemented by the multilayer structure illustrated in FIG. 14, three or more bulk acoustic resonators 100 may be implemented by the multilayer structure depending on a design. Adjacent bulk acoustic resonators 100 may be electrically connected to each other by a wiring electrode. As an example, the wiring electrode may connect first electrodes 140 of the adjacent bulk acoustic resonators 100 to each other, and may connect second electrodes 160 of the adjacent bulk acoustic resonators 100 to each other.

The bulk acoustic resonator 100 may include a substrate 110, an insulating layer 120, an air cavity 112, and a resonant part 135.

The substrate 110 may be a silicon substrate, and the insulating layer 120 electrically isolating the resonant part 135 from the substrate 110 may be provided on an upper surface of the substrate 110. The insulating layer 120 may be formed on the substrate 110 by chemical vapor deposition, radio frequency (RF) magnetron sputtering, or evaporation using one of a silicon dioxide ($SiO_2$) or an aluminum oxide ($Al_2O_3$).

The air cavity 112 may be disposed on the insulating layer 120. The air cavity 112 may be positioned below the resonant part 135 so that the resonant part 135 may vibrate in a given direction. The air cavity 112 may be formed by a process of forming a sacrificial layer pattern on the insulating layer 120, forming a membrane 130 on the sacrificial layer pattern, and then etching and removing the sacrificial layer pattern. The membrane 130 may serve as the oxidation protecting film, or may serve as the protective layer protecting the substrate 110.

An etch stop layer 125 may be additionally formed between the insulating layer 120 and the air cavity 112. The etch stop layer 125 may serve to protect the substrate 110 and the insulating layer 120 from an etching process, and may serve as a base required for depositing several different layers on the etch stop layer 125.

The resonant part 135 may include the first electrode 140, a piezoelectric layer 150, and the second electrode 160 sequentially stacked on the membrane 130. A common region in which the first electrode 140, the piezoelectric layer 150, and the second electrode 160 overlap one another in a vertical direction may be positioned above the air cavity 112. The first electrode 140 and the second electrode 160 may be formed of one or more of gold (Au), titanium (Ti), tantalum (Ta), molybdenum (Mo), ruthenium (Ru), platinum (Pt), tungsten (W), aluminum (Al), iridium (Ir), and nickel (Ni), or alloys thereof.

The piezoelectric layer 150, which generates a piezoelectric effect that electrical energy is converted into mechanical energy having an elastic waveform, may be formed of one of an aluminum nitride (AlN), a zinc oxide (ZnO), and a lead zirconate titanate oxide (PZT; PbZrTiO). In addition, the piezoelectric layer 150 may further include a rare earth metal. As an example, the rare earth metal may include one or more of scandium (Sc), erbium (Er), yttrium (Y), and lanthanum (La).

A seed layer for improving crystal alignment of the piezoelectric layer 150 may be additionally disposed below the first electrode 140. The seed layer may be formed of one or more of an aluminum nitride (AlN), a zinc oxide (ZnO), and a lead zirconate titanate oxide (PZT; PbZrTiO) having the same crystallinity as that of the piezoelectric layer 150.

The resonant part 135 may be divided into an active region and an inactive region. The active region of the resonant part 135, a region vibrating and resonating in a given direction by a piezoelectric phenomenon generated in the piezoelectric layer 150 when electrical energy such as a radio frequency signal is applied to the first electrode 140 and the second electrode 160, may correspond to a region in which the first electrode 140, the piezoelectric layer 150, and the second electrode 160 overlap one another in the vertical direction above the air cavity 112. The inactive region of the resonant part 135, a region that does not resonate by the piezoelectric phenomenon even through the electrical energy is applied to the first and second electrodes 140 and 160, may correspond to a region outside the active region.

The resonant part 135 may output a radio frequency signal having a specific frequency using the piezoelectric phenomenon. In detail, the resonant part 135 may output a radio frequency signal having a resonant frequency corresponding to vibrations depending on the piezoelectric phenomenon of the piezoelectric layer 150.

A protective layer 170 may be disposed on the second electrode 160 of the resonant part 135 to prevent the second electrode 160 from being externally exposed. The protective layer 170 may be formed of one or more of a silicon oxide based insulating material, a silicon nitride based insulating material, and an aluminum nitride based insulating material.

One or more via hole 113 disposed to penetrate through the substrate 110 in a thickness direction may be formed in a lower surface of the substrate 110. The via hole 113 may penetrate through portions of the insulating layer 120, the etch stop layer 125, and the membrane 130 in the thickness direction, in addition to the substrate 110. A connection pattern 114 may be formed in the via hole 113, and may be formed over the entirety of an inner surface, that is, an inner wall, of the via hole 113.

The connection pattern 114 may be manufactured by forming a conductive layer on the inner surface of the via hole 113. As an example, the connection pattern 114 may be formed by depositing, applying, or filling one or more conductive metal of gold (Au), copper (Cu), or a titanium (Ti)-copper (Cu) alloy along the inner wall of the via hole 113.

The connection pattern 114 may be connected to one or both of the first electrode 140 and the second electrode 160. As an example, the connection pattern 114 may penetrate through at least portions of the substrate 110, the membrane 130, the first electrode 140, and the piezoelectric layer 150, and be then electrically connected to one or both of the first electrode 140 and the second electrode 160. The connection pattern 114 formed on the inner surface of the via hole 113 may be extended to the lower surface of the substrate 110 to be thus connected to a connection pad 115 provided on the lower surface of the substrate 110. Therefore, the connection pattern 114 may electrically connect the first electrode 140 and the second electrode 160 to the connection pad 115. As an example, the connection pad 115 may include copper (Cu).

The connection pad 115 may be electrically connected to a main board that may be disposed below the filter through a bump. The bulk acoustic resonator 100 may perform a filtering operation of a radio frequency signal by a signal applied from the main board to the first and second electrodes 140 and 160 through the connection pad 115. The filter connected to the main board may form a filter module.

The cap 200 may be bonded to the multilayer structure forming the plurality of bulk acoustic resonators 100 to protect the plurality of bulk acoustic resonators 100 from the external environment. The cap 200 may be packaged together with the multilayer structure in a wafer level.

The cap 200 may have a cover form including an internal space in which the plurality of bulk acoustic resonators 100 are accommodated. The cap 200 may have a hexahedral shape in which a lower surface thereof is opened, and thus have an upper surface and a plurality of side surfaces.

In detail, the cap 200 may have an accommodating part formed at the center thereof to accommodate the resonant parts 135 of the plurality of bulk acoustic resonators 100 therein, and an edge of the cap 200 may be stepped as compared to the accommodating part so that the cap 200 may be bonded to a bonded region of the multilayer structure. The bonded region of the multilayer structure may correspond to an edge of the multilayer structure.

A case in which the cap 200 is bonded to the protective layer 170 stacked on the substrate 110 is illustrated in FIG. 14, but the cap 200 may be bonded to one or more of the membrane 130, the etch stop layer 125, the insulating layer 120, and the substrate 110, in addition to the protective layer 170.

The cap 200 may be bonded to the multilayer structure by eutectic bonding. After an adhesive 250 that may be eutectically bonded is deposited on the multilayer structure, the multilayer structure and the cap 200 may be pressed and heated to be thus bonded to each other.

The adhesive 250 may include one or more adhesive layer to eutectically bond the multilayer structure and the cap 200 to each other. The adhesive 250 may be provided in a bonded region between the multilayer structure and the cap 200.

The adhesive 250 may include three or more adhesive layers sequentially stacked or disposed between the multilayer structure and the cap 200. As an example, the adhesive 250 may include a first adhesive layer 251, a second adhesive layer 252, and a third adhesive layer 253. The first adhesive layer 251 may include one or more of gold (Au), copper (Cu), silver (Ag), platinum (Pt), nickel (Ni), or palladium (Pd), the second adhesive layer 252 may include tin (Sn), and the third adhesive layer 253 may include one or more of gold (Au), copper (Cu), silver (Ag), platinum (Pt), nickel (Ni), or palladium (Pd). The first adhesive layer 251 and the third adhesive layer 253 may be formed of the same material to enable the eutectic bonding together with the second adhesive layer 252.

One or more switch 300 may be provided on an upper surface of the cap 200. The switch 300 of FIG. 14 may correspond to the switches illustrated in FIGS. 8A, 9A and 9B, 10A, and 12A and 12B, and the transistor illustrated in FIG. 11A. The switch 300 may be formed on the upper surface of the cap 200 by a complementary metal oxide semiconductor (CMOS) process. The switch 300 may be formed on the cap 200 before or after the cap 200 and the multilayer structure are bonded to each other.

A connection electrode 210 and a cap connection pad 220 for providing an electrical connection path of the switch 300 may be formed in the cap 200. The cap 200 may include one or more connection electrode 210, which may penetrate through the upper surface of the cap 200 in the thickness direction and may be approximately vertically formed.

The cap connection pad 220 may be provided along the upper surface of the cap 200 and be connected to the switch 300 exposed to the upper surface of the cap 200, and one or more connection electrode 210 may be connected to the switch 300 through the cap connection pad 220 extended along the upper surface of the cap 200.

One or more connection electrode 210 may be extended to the upper surface of the cap 200 and be connected to one or both of the first electrode 140 and the second electrode 160. A case in which the connection electrode 210 is connected to the first electrode 140 and the second electrode 160 is illustrated in FIG. 14, but the connection electrode 210 may be disposed to penetrate through the first electrode 140 and the second electrode 160 and be then connected directly to the connection pattern 114 electrically connected to the first electrode 140 and the second electrode 160.

A switching operation of the switch 300 may be controlled by a signal applied from the main board disposed below the filter to the switch 300 through the connection pattern 114 and the connection pad 115.

According to an embodiment, the switch 300 may be operated by a control of the main board disposed below the filter in a state in which it is adjacent to the filter, and formation of a complicated circuit pattern provided at a large length on the main board in order to connect the switch and the filter module to each other in the related art may be thus avoided, resulting in reducing the signal loss generated due to the parasitic component and increasing efficiency of an area of the board in which components are mounted.

As set forth above, the filter module according to an embodiment may include a plurality of filters, and one or more filter may control bands having overlapping bandwidths, such that the size and manufacturing costs of the filter module may be decreased.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A filter, comprising:
one or more series units; and
a shunt unit disposed between the one or more series units and ground,
wherein the one or more series units comprise series resonators which are configured to be selectively oper- ated, and each of the plurality of series resonators includes a film bulk acoustic resonator, wherein the one or more series resonators comprise a first series resonator and a second series resonator, wherein the one or more series units comprise a first switch connected to the first series resonator in series, and a second switch connected to the second series resonator in series, and wherein the first series resonator and the second series resonator are connected to each other in parallel through the first switch and the second switch.

2. The filter of claim 1, wherein the first series resonator and the second series resonator have different resonant frequencies.

3. The filter of claim 2, wherein a frequency band of the filter varies depending on a selective operation of the first series resonator and the second series resonator.

4. The filter of claim 3, wherein an upper limit frequency of the frequency band varies depending on the selective operation of the first series resonator and the second series resonator.

5. The filter of claim 4, wherein a resonant frequency of the first series resonator is higher than that of the second series resonator, and the frequency band of the first series resonator, is wider, than that of the second series resonator.

6. The filter of claim 1, wherein the filter is included in a filter module comprising additional filters, and is connected to a notch filter in series, and where the notch filter and the filter module are disposed on a single chip.

7. The filter of claim 1, wherein the filter having an allocated frequency band, among frequency bands, the filter being configured to control communication bands included in the allocated frequency band having overlapping bandwidths with each other.

8. The filter of claim 1, wherein the first series resonator and the second series resonator are configured to be selectively operated, depending on switching operations of the first switch and the second switch.

9. The filter of claim 1, wherein the first series resonator, the second series resonator, the first switch, and the second switch are on a single chip.

10. A filter module, comprising:
filters, each filter having an allocated frequency band, among frequency bands, and each filter being configured to control communications bands included in the allocated frequency band having overlapping bandwidths with each other, wherein each of the communications bands included in the allocated frequency band of one or more of the filters has a different limit frequency from others of the communications bands included in the allocated frequency band of the one or more of the filters, and wherein the one or more of the filters is configured to change one of an upper limit frequency and a lower limit frequency of the allocated frequency band of the one or more of the filters such that overlapping of the bandwidths is maintained.

11. A front end module comprising:
an antenna transmitting and receiving radio frequency signals;
a filter module including a plurality of filters configured to filter a specific frequency band in the radio frequency signals transmitted and received through the antenna;
a notch filter disposed between the filter module and the antenna, and one of the plurality of filters connected to the antenna through the notch filter,
wherein the notch filter and the filter module are on a single chip.

12. The front end module of claim 11, wherein the notch filter is connected to the one of the plurality of filters in series and is selectively operated.

13. The front end module of claim 12, wherein an upper limit frequency of the one of the plurality of filters varies depending on the selective operation of the notch filter.

14. The front end module of claim 12, wherein a frequency band of the one of the plurality of filters varies depending on a selective operation of the notch filter.

15. The front end module of claim 14, wherein a unique frequency band of the one of the plurality of filters is wider than the frequency band of the one of the plurality of filters at the time of operation of the notch filter.

16. The front end module of claim 15, wherein the switch is on the single chip.

17. The front end module of claim 12, further comprising a switch selectively connecting the notch filter and the one of the plurality of filters to each other.

18. The front end module of claim 11, wherein the one of the plurality of filters having an allocated frequency band, among frequency bands, the one filter being configured to control communication bands included in the allocated frequency band having overlapping bandwidths with each other.

* * * * *